US011736130B2

United States Patent
Falempin et al.

(10) Patent No.: US 11,736,130 B2
(45) Date of Patent: Aug. 22, 2023

(54) DEVICE FOR LINEARISING A POWER AMPLIFIER OF A COMMUNICATION SYSTEM BY DIGITAL PREDISTORTION

(71) Applicant: Commissariat à l'énergie atomique et aux énergies alternatives, Paris (FR)

(72) Inventors: Alexis Falempin, Grenoble (FR); Rafik Zayani, Grenoble (FR); Jean-Baptiste Doré, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 17/810,476

(22) Filed: Jul. 1, 2022

(65) Prior Publication Data

US 2023/0020369 A1    Jan. 19, 2023

(30) Foreign Application Priority Data

Jul. 5, 2021    (FR) ...................................... 21 07230

(51) Int. Cl.
*H04B 1/04*     (2006.01)
*G06N 3/08*     (2023.01)

(52) U.S. Cl.
CPC ............. *H04B 1/0475* (2013.01); *G06N 3/08* (2013.01); *H04B 2001/0425* (2013.01)

(58) Field of Classification Search
CPC . H04B 1/0475; H04B 2001/0425; G06N 3/08
See application file for complete search history.

(56) References Cited

U.S. PATENT DOCUMENTS

| 2018/0287569 | A1* | 10/2018 | Xu ........................... H03F 3/20 |
| 2020/0295975 | A1* | 9/2020 | Li ............................. H03F 1/32 |
| 2021/0243056 | A1* | 8/2021 | Li ............................. H03F 3/20 |
| 2022/0198253 | A1* | 6/2022 | Benosman ............ G06F 18/214 |
| 2022/0368571 | A1* | 11/2022 | Yu ........................... H03F 3/195 |

OTHER PUBLICATIONS

French Preliminary Search Report dated Feb. 28, 2022 in French Application 21 07230 filed on Jul. 5, 2021, 3 pages (with English Translation of Categories of Cited Documents).
Pochmara, "Improving Compensation of Nonlinear Distortions in OFDM System Using Recurrent Neural Network With Conjugate Gradient Algorithm", Personal, Indoor and Mobile Radio Communications, IEEE, 2004, pp. 180-185.

(Continued)

*Primary Examiner* — Emmanuel Bayard
(74) *Attorney, Agent, or Firm* — Oblon, McClelland, Maier & Neustadt, L.L.P.

(57) ABSTRACT

The invention relates to a device for linearising a power amplifier by employing digital predistortion, comprising: a digital predistortion module, configured to infer a polar domain predistortion to be applied to a signal, and comprising a first neural network and a second neural network respectively configured to correct amplitude and phase distortion produced by the amplifier; an optimisation module of each of said neural networks configured to implement metalearning, using: a meta-initialisation providing a prior initialisation of the initial weights of each of said neural networks; a meta-matching of the initial weights into optimal weights of each of said neural networks.

10 Claims, 4 Drawing Sheets

(56) References Cited

OTHER PUBLICATIONS

Watkins et al., "Predistortion of Nonlinear Amplifiers Using Neural Networks", Military Communications Conference, IEEE, 1996, pp. 316-320.
Ibnkahla, "Neural Network Predistortion Technique for Digital Satellite Communications", Acoustics, Speech, and Signal Processing, IEEE, 2000, pp. 3506-3509.
Deng et al., "Is the Meta-Learning Idea Able to Improve the Generalization of Deep Neural Networks on the Standard Supervised Learning?", 2020 25$^{th}$ International Conference on Pattern Recognition (ICPR), Jan. 10, 2021, pp. 150-157.
Kingma et al., "ADAM: A Method for Stochastic Optimization", arXiv:1412.6980v9 [cs.LG], Jan. 30, 2017, 15 pages.
Antoniou et al., "How to Train Your MAML", arXiv:1810.09502v3 [cs.LG], Mar. 5, 2019, 11 pages.
Simeone et al., "From Learning to Meta-Learning: Reduced Training Overhead and Complexity for Communication Systems", arXiv:2001.01227v1 [cs.LG], Jan. 5, 2020, 11 pages.
Finn et al., "Model-Agnostic Meta-Learning for Adaptation of Deep Networks", arXiv:1703.03400v3 [cs.LG], Jul. 18, 2017, 13 pages.
Liu et al., "On the Variance of the Adaptive Learning Rate and Beyond", arXiv:1908.03265v3 [cs.LG], Apr. 17, 2020, 14 pages.

\* cited by examiner

DEVICE FOR LINEARISING A POWER AMPLIFIER OF A COMMUNICATION SYSTEM BY DIGITAL PREDISTORTION

CROSS-REFERENCE TO RELATED APPLICATIONS

This application is a U.S. non-provisional application claiming the benefit of French Application No. 21 07230, filed on Jul. 5, 2021, which is incorporated herein by reference in its entirety.

FIELD

The present invention relates to a device for linearising, by digital predistortion, a power amplifier of a communication system comprising at least one radio frequency transmitter configured to transmit at least one frame of symbols.

The present invention also relates to a communication system, a linearisation method and an associated computer program.

The invention is in the field of power amplification implemented for wireless communication systems. In transmission, the power amplifier is configured to provide sufficient power to the transmitted signal so that it can properly reach its destination. Because of this role, the power amplifier is the most important energy consumer in the transmission chain, as it can consume up to 80% of the total power consumed by the transmission chain.

As a result, the power consumption of a power amplifier directly impacts the battery life of mobile terminals, or the energy consumption of a mobile operator, and one of the objectives of the present invention is to significantly improve the power efficiency of a radio frequency power amplifier so as to improve the overall energy efficiency of wireless communication systems and thereby reduce their carbon footprint.

In particular, it should be noted that a radio frequency power amplifier exhibits non-linear distortions, especially in amplitude and phase, when operating near its saturation level where its energy efficiency is also highest, making it necessary to find the best compromise between linearisation and energy efficiency.

BACKGROUND

To improve linearisation, techniques have been proposed including digital predistortion, which consists of adding a module upstream of the power amplifier, so that the signal output from the combination of this predistortion module and the amplifier is substantially linear.

However, the design of the digital predistortion module to provide an inverse characteristic of the power amplifier in order to compensate for distortions is often complex.

Solutions for the design of digital predistortion modules based on the use of neural networks for solving non-linear problems have been investigated, but such solutions are so far unsuitable when considering amplifiers whose operation varies in time and/or in the context of their use.

Indeed, on the one hand, current solutions based on the use of neural networks provide a good estimate of the inverse characteristic of the power amplifier, but only for a given usage model of this power amplifier, and any variation in usage (i.e. variation in usage configuration) requires a re-learning of the neural network(s) used. On the other hand, these solutions require a sufficient amount of data and associated learning time that are not suitable for real-time communication systems.

SUMMARY

The purpose of the invention is to remedy the disadvantages of the present state of the art by proposing an alternative digital predistortion module design technique based on the use of neural networks, which is capable of reducing the amount of data required for training as well as the training time, whilst being capable of adapting in real time to a variation in the usage of the power amplifier in question.

To that end, the present invention relates to a device for linearising, by digital predistortion, a power amplifier of a communication system comprising at least one radio frequency transmitter configured to transmit at least one frame of symbols, the linearising device comprising:

a module for digitally predistorting the signal supplied by the radio frequency transmitter configured to infer a polar domain predistortion to be applied to said signal, the predistortion module having an indirect neural network learning architecture and comprising:

a first neural network configured to correct an amplitude distortion produced by the power amplifier by receiving as input the amplitude of the output $|y|$ of the power amplifier, the first neural network being configured to provide a reciprocal function $f_n^{-1}$ of the amplitude distortion function produced by the power amplifier;

a second neural network configured to correct a phase distortion produced by the power amplifier by receiving as input the amplitude of the input $|x|$ of the power amplifier, the second neural network being configured to provide a phase function $f_{-\Phi}$ providing the opposite in phase of each phase;

the linearising device further comprising:

a module for optimising the first neural network and optimising the second neural network configured to implement:

a meta-learning of the first neural network, and
a meta-learning of the second neural network, the optimisation module being configured to implement each meta-learning from a set of operating data of the power amplifier, each meta-learning comprising a plurality of distinct prediction tasks respectively associated with distinct groups of operating data and metadata from the data set, the distinct groups being representative of distinct use cases of the power amplifier, the optimisation module being configured to implement the meta-learning of the first neural network, and the meta-learning of the second neural network, using:

from a first part of said previously obtained data set, a meta-initialisation of the first neural network, respectively of the second neural network, providing beforehand an initialisation of the initial weights of the first neural network, respectively of the second neural network;

from said initial weights and a second part of said data set corresponding to the current use case of the power amplifier, a meta-matching of the initial weights into optimal weights of the first neural network, respectively of the second neural network;

the optimisation module being configured to train the first neural network and the second neural network by optimising a cost function.

Advantageously, the architecture of the power amplifier linearising device, employing digital predistortion, as proposed according to the present invention, has a reduced complexity, since it is specifically based on a breakdown into two neural networks in the polar domain, one being dedicated to a custom correction of the amplitude distortion capable of being generated by the power amplifier considered, and the other dedicated to a custom correction of the phase distortion. Furthermore, the optimisation module according to the present invention, configured to implement meta-learning, is advantageously suitable for rapidly determining a linearising device by digital predistortion, adapted to any operating variation of the power amplifier in question.

In other words, according to the present invention, the proposed linearising device has an adaptive behaviour, as it is able to easily adapt the linearisation in the presence of a change of operation of the considered power amplifier or in the presence of a change of usage context, and the calibration of each of the two neural networks, dedicated respectively to correcting the amplitude and phase distortions introduced by the considered power amplifier, is able to be carried out in real time (i.e. on-line) with a reduced training dataset and associated computational complexity compared to current solutions based on the use of neural networks.

The power amplifier linearising device employing digital predistortion according to the present invention may have one or more of the following features, taken independently or in any combination that is technically possible:

the first neural network configured to correct an amplitude distortion produced by the power amplifier receives as input the amplitude of the output |y| of the power amplifier, the first neural network being configured to provide a reciprocal function $f^{\circ}$ of the amplitude distortion function produced by the power amplifier; such that:

$f^{\circ}(|y|) = g_0(|y|) + g_1(|y|)$ with:

$g_0(|y|) = \gamma_0(|y|) + (1 - \gamma_0(|y|))|y|$ where $\gamma_0(|y|) = (1 + e^{-\alpha(|y| - \omega^\rho)})^{-1}$, and $g_1(|y|) = \sum_{j=1}^{N_n^\rho} \omega_j^\rho [\text{ReLu}(W_\rho |y| + b_\rho)]_j$ where $\alpha$, $\omega_\rho$, $\omega_j^\rho \in \mathbb{R}$, $W_\rho \in \mathbb{R}^{1 \times N_n^\rho}$ and $b_\rho \in \mathbb{R}^{1 \times N_n^\rho}$ are the weights of the first neural network whose initial value is optimised by meta-learning, ReLu is the activation function of the rectified linear unit, and where $N_n^\rho$ corresponds to the number of neurons in the first neural network;

the second neural network configured to correct a phase distortion produced by the power amplifier, receives as input the amplitude of the input |x| of the power amplifier, the second neural network (34) being configured to provide a phase function $f_{-\Phi}$ providing the opposite in phase of each phase such that:

$f_{-\Phi}(|x|) = \gamma_1(|x|) g_2(|x|)$ with:

$\gamma_1(|x|) = (1 + e^{-\beta(|x| - \omega\Phi)})^{-1}$ and $g_2(|x|) = \sum_{j=1}^{N_n^\Phi} \omega_j^\Phi [\text{ReLu}(W_\Phi |x| + b_\Phi)]_j$ where $\beta$, $\omega_\Phi$, $\omega_j^\Phi \in \mathbb{R}$, $W_\Phi \in \mathbb{R}^{1 \times N_n^\Phi}$ and $b_\Phi \in \mathbb{R}^{1 \times N_n^\Phi}$ are the weights of the second neural network whose initial value is optimised by meta-learning, ReLu is the activation function of the rectified linear unit, and where $N_n^\Phi$ corresponds to the number of neurons in the second neural network;

each separate prediction task is at least associated with a separate value characterising a variation in the behaviour of the power amplifier;

the optimisation module is configured to implement meta-learning of the weights of the first neural network, and/or meta-learning of the weights of the second neural network, using meta-learning agnostic to the neural network model used;

the optimisation module is configured to train the first neural network and the second neural network by optimising a cost function corresponding to the mean squared error by means of an ADAM or RADAM optimiser;

a data acquisition module configured to populate each separate operating and metadata data group of the power amplifier data set by sampling a predetermined number of symbols from the output of the radio frequency transmitter, the set of sampled symbols conforming to a predetermined statistical distribution in amplitude of said predetermined number of symbols.

The invention further relates to a communication system comprising at least successively:

a radio frequency modulator;

a radio frequency transmitter capable of transmitting at least one frame of symbols whose input is connected to the output of the frequency modulator;

a linearising device employing digital predistortion according to any of the preceding claims, the input of the linearising device being connected to the output of said radio frequency transmitter; and a power amplifier whose input is connected to the output of the linearising device, the communication system comprising a feedback loop from the power amplifier to the linearising device.

The invention also relates to a method of linearising, by adaptive digital predistortion, a power amplifier of a communication system comprising a radio frequency transmitter configured to transmit at least one frame of symbols, the method comprising the following steps:

a step of digitally predistorting the signal provided by the radio frequency transmitter by determining a polar predistortion to be applied to said signal by implementing an inference step through:

a first neural network configured to correct an amplitude distortion associated with the power amplifier; and a second neural network configured to correct a phase distortion associated with the power amplifier, a step of optimizing the first neural network and optimizing the second neural network by:

a meta-learning of the first neural network, and a meta-learning of the second neural network, each meta-learning being implemented from a set of operating data of the power amplifier, each meta-learning comprising a plurality of distinct prediction tasks respectively associated with distinct groups of operating data and metadata from the data set, the distinct groups being representative of distinct use cases of the power amplifier, the meta-learning of the first neural network, and the meta-learning of the second neural network, comprising:

from a first part of said previously obtained data set, a meta-initialisation of the first neural network, respectively of the second neural network, providing beforehand an initialisation of the initial weights of the first neural network, respectively of the second neural network;

from said initial weights and a second part of said data set corresponding to the current use case of the power amplifier, a meta-matching of the initial weights into optimal weights of the first neural network, respectively of the second neural network.

The invention further relates to a computer program comprising software instructions, which, when carried out by a computer, implement a method of linearising, by adaptive digital predistortion, a power amplifier of a communication system, as defined above.

Hereafter, the reference to a computer program which, when executed, performs any of the above software instructions, is not limited to an application program running on a single host computer.

In other words, the terms computer program and software are hereinafter used in a general sense to refer to any type of computer code (e.g., application software, firmware, microcode, or any other form of computer instruction) that can be used to program one or more processors to implement the process of linearising, by adaptive digital predistortion, a power amplifier of a communication system as defined above.

BRIEF DESCRIPTION OF THE DRAWINGS

Further features and advantages of the invention will become apparent from the detailed description given below, by way of indication and not in any way limiting, with reference to the appended figures, in which.

DETAILED DESCRIPTION

In the following, the term "substantially" is used to express a relationship of equality plus or minus 10%, i.e. with a variation of at most 10%, preferably still as a relationship of equality plus or minus 5%, i.e. with a variation of at most 5%.

Figure 1:
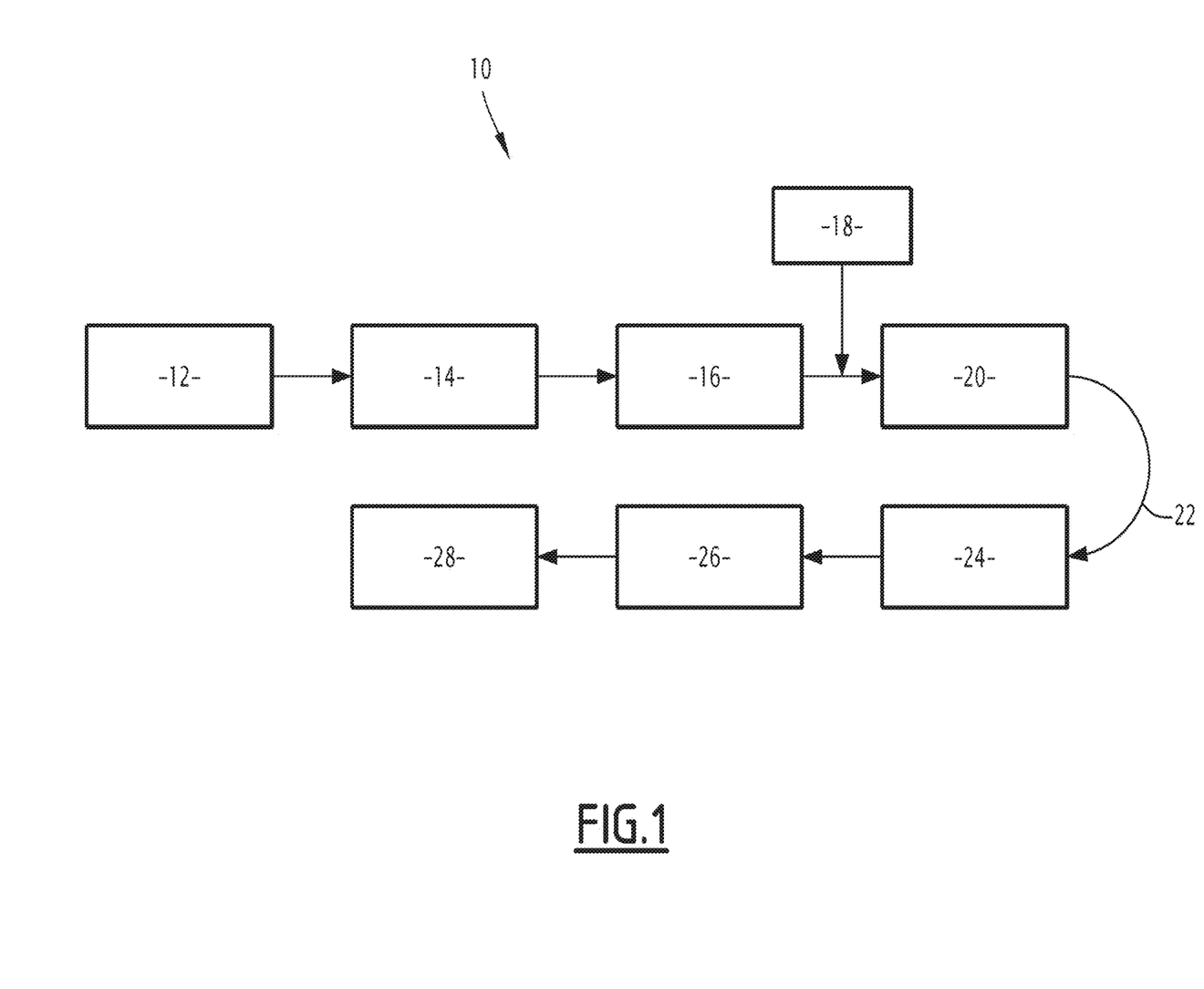
FIG. 1 is a schematic view of a communication system according to the present invention.

FIG. 1 schematically represents the general architecture of a communication system 10 according to the present invention. More precisely, the communication system 10 receives at the input of a transmission chain a stream 12 of data, in particular expressed in the form of data bits.

The transmission chain of the communication system 10 firstly comprises a radio frequency modulator 14 configured to modulate the data stream 12, in particular in amplitude and phase, using for example quadrature amplitude modulation (QAM) or phase-shift keying (PSK), etc.

Then, at the output of the radio frequency modulator 14, the transmission chain comprises a radio frequency transmitter 16 capable of transmitting at least one frame of symbols obtained from the modulated signal supplied at the output by the radio frequency modulator 14. For example, the radio frequency transmitter 16 is an orthogonal multicarrier OFDM (Orthogonal Frequency Division Multiplexing) waveform generator, a third generation CDMA (Code Division Multiple Access) waveform generator, a single-carrier waveform generator, a microwave beam generator, etc.

Figure 2:
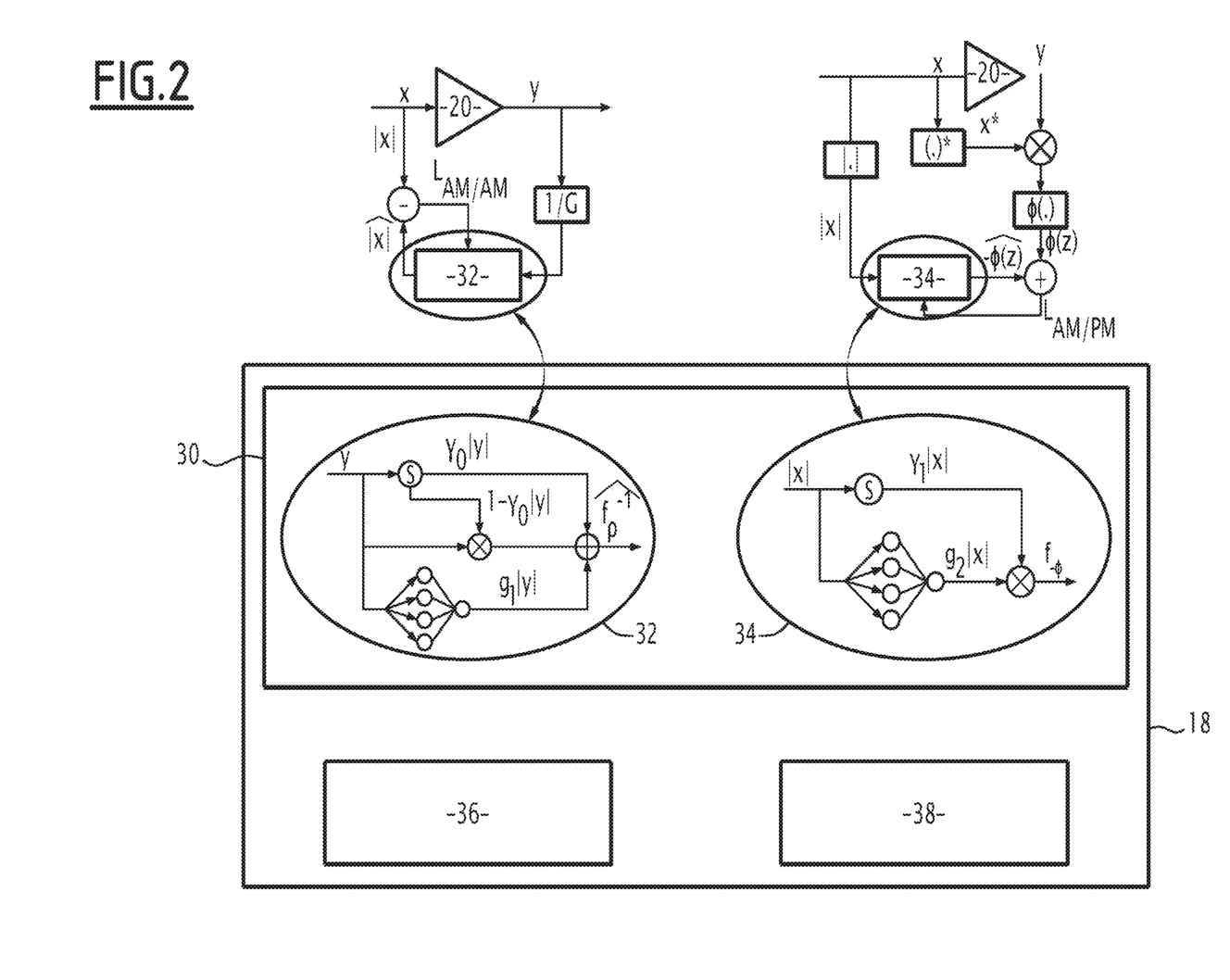
FIG. 2 shows schematically the structure of a device for linearising, by digital predistortion, a power amplifier of the communication system according to FIG. 1.

As proposed according to the present invention, the communication system 10 further comprises a linearising device 18 employing digital predistortion DPD, the specific structure of which is detailed hereafter in relation to FIG. 2. Such a linearising device (18), by digital predistortion (DPD), is suitable for compensating for the distortions introduced by a power amplifier (20) itself placed upstream of at least one transmission antenna (not shown) in the communication system's transmission chain.

In other words, the input of the linearising device 18 employing digital predistortion DPD is connected to the output of the radio frequency transmitter 16, and its output is located upstream of the power amplifier 20, so that the signal, provided at the output of the combination of this linearising device 18 employing digital predistortion DPD followed by the power amplifier 20, is substantially linear.

The communication system 10 further comprises a reception chain comprising a radio frequency receiver 24 reciprocally associated with the radio frequency transmitter 16 of the transmission chain. In other words, if an OFDM transmitter 16 is used in the transmission chain, the reception chain reciprocally comprises an OFDM receiver, similarly if a CDMA transmitter 16 is used in the transmission chain, the reception chain reciprocally comprises a CDMA receiver, etc.

Similarly, the reception chain comprises a demodulator 26 reciprocally associated with the modulator 14 of the transmission chain, for example a QAM demodulator when a QAM modulator is used within the transmission chain, the demodulator being configured to provide a demodulated signal 28 substantially corresponding to the data stream 12.

The power amplifier 20, whose linearisation is the object of the present invention, has an input denoted x and an output denoted y, and is suitable for generating an amplitude distortion, expressed for example by means of a distortion function $f_p$, and a phase distortion, expressed for example by means of a distortion function $f_\Phi$, such that:

$$|y| = f_p(|x|) \quad (1)$$

$$\arg(y) = f_\Phi(|x|) + \arg(x) \quad (2).$$

For example, considering the mathematical and theoretical Rapp model, especially for frequencies above 6 GHz, the two distortion functions $f_p$ and $f_\Phi$ are expressible as follows:

$$f_p(u) = \frac{Gu}{\left(1 + \left|\frac{Gu}{V_{sat}}\right|^{2p}\right)^{\frac{1}{2p}}} \quad (3)$$

$$f_\Phi(u) = \frac{Au^q}{\left(1 + \left(\frac{u}{A'}\right)^q\right)} \quad (4)$$

where G is the gain in the linear region of the power amplifier 20, p is the knee factor of the Rapp model, and $V_{sat}$ is the saturation voltage value of the power amplifier 20, A, A' and q are adjustment parameters, considering an Input Back-Off (IBO) in the following form:

$$IBO = \frac{P_{1dB,in}}{P_{\alpha,in}}$$

where $P_{1dB,in}$ is the input power at the 1 dB compression point and $P_{\alpha,in}$ is the average input power, assuming a noise-free power amplifier 20.

FIG. 2 schematically depicts the specific structure according to the present invention of the linearising device 18 employing digital predistortion of the power amplifier 20 of the communication system 10 according to FIG. 1.

The specific structure of the linearising device 18 employing digital predistortion according to the present invention is based on an indirect learning architecture ILA by a neural network and comprises for this purpose first of all a module 30 for digital predistortion of the signal supplied by the radio frequency transmitter 16 of FIG. 1.

Such a digital predistortion module 30 based on an indirect neural network learning architecture is configured to infer a polar domain predistortion to be applied to the signal provided by the radio frequency transmitter 16, the predistortion module 30 comprising:

- a first neural network 32 configured to correct an amplitude distortion produced by the power amplifier 20 by receiving as input the amplitude of the output |y| of the power amplifier 20, the first neural network 32 being configured to provide a reciprocal function $f_p^{-1}$ of the amplitude distortion function produced by the power amplifier;
- a second neural network 34 configured to correct a phase distortion produced by the power amplifier 20 by receiving as input the amplitude of the input |x| of the power amplifier 20, the second neural network 34 being configured to provide a phase function $f_{-\Phi}$, providing the opposite in phase of each phase.

In other words, the indirect neural network learning architecture proposed according to the present invention for implementing power amplifier 20 linearisation through digital predistortion is characteristic in that it is specifically designed to separately process the amplitude and phase distortions introduced by the power amplifier 20 located downstream of the linearising device 18 employing digital predistortion, using a polar decomposition of the signal.

Such an indirect learning design based on a polar decomposition also improves linearisation performance, especially compared to conventional direct learning techniques.

The polar decomposition implemented by the present invention results in the use of two distinct neural networks 32 and 34 dedicated respectively to the correction of an amplitude distortion produced by the power amplifier 20 for the first neural network 32, and of a phase distortion produced by the power amplifier 20 for the second neural network 34, and each having a low implementation complexity.

In particular, to reverse the amplitude distortion produced by the power amplifier 20, the first neural network 32 is custom-designed (i.e. entirely specific to the present invention) to determine the reciprocal function $f_p^{-1}$ of the amplitude distortion function $f_p$ produced by the power amplifier 20 as indicated above (equation (1)), and receives as input the amplitude of the output |y| of the power amplifier 20, if necessary normalised in gain by applying a factor 1/G with G the gain, as illustrated in FIG. 2.

More precisely, the first neural network 32 is optimised so that the composite of the amplitude distortion function $f_p$ and the reciprocal function of this amplitude distortion $f_p^{-1}$ is equal to the gain of the signal |x| to which such a composite is applied, the reciprocal function $f_p^{-1}$ having a unitary gain, a normalisation by 1/G being implemented only in the training phase:

$$(f_p \circ f_p^{-1})(|x|) = G|x| \quad (6)$$

$f_p^{-1}(|y|) = g_0(|y|) + g_1(|y|) = |\hat{x}|$ with:

$g_0(|y|) = \gamma_0(|y|) + (1-\gamma_0(|y|))|y|$ where $\gamma_0(|y|) = (1+e^{-\alpha(|y|-\omega^\rho)})^{-1}$, and $g_1(|y|) = \sum_{j=1}^{N_n^\rho} \omega_j^\rho [\text{ReLu}(W_\rho b_\rho)]_j$ where $\alpha, \omega_\rho, \omega_j^\rho \in \mathbb{R}$, $W_\rho \in \mathbb{R}^{1 \times N_n^\rho}$ and $b_\rho \in \mathbb{R}^{1 \times N_n^\rho}$ are the weights of the first neural network whose initial value is optimised by meta-learning, ReLu is the rectified linear unit activation function defined in particular as $f(U_i) = \max(0, U_i)$ with $U_i = [U]_i$ where the index i corresponds to the $i^{th}$ element of the vector $U$, and where $N_n^\rho$ corresponds to the number of neurons of the first neural network 32, for example advantageously according to the present invention $N_n^\rho$ is substantially comprised between eight and ten neurons for the correction of the amplitude.

In the following, "meta-learning" is taken to mean the concept of neural network learning, which has been introduced in particular recently in the field of wireless communications as described in the paper by O. Simeone et al. entitled "*From Learning to Meta-Learning: Reduced Training Overhead and Complexity for Communication Systems*". However, this learning concept has so far not been specifically applied and adapted to the design of an adaptive power amplifier linearising device 18 employing digital predistortion.

Specifically, the function $g_0$ is used to model the reciprocal function of the amplitude distortion function $f_p$ produced by the power amplifier 20 while the function $g_1$ is used to refine it.

In addition, as illustrated in FIG. 2, the first neural network 32 is suitable to also receive the input $L_{AM/AM}$ such that for example:

$$L_{AM/AM} = \frac{1}{N} \sum_{k=1}^{N} |||x_i| - |\hat{x}_i|||^2$$

where N is the size of the training dataset, the input $L_{AM/AM}$ corresponds to a cost function corresponding to the mean squared error between the input signal amplitude x of the power amplifier 20 (i.e. corresponding to the amplitude of the output signal of the radio frequency transmitter 16) and the estimate of this input amplitude provided by the first neural network 32, this cost function being suitable for use by an optimisation module 36 of the linearising device 18 employing digital predistortion, as described subsequently.

Furthermore, in order to invert the phase distortion produced by the power amplifier 20, the second neural network 34 is custom-designed to determine the phase opposite function $f_{-\Phi}$ (i.e. outputting the phase opposite of each phase) of the phase distortion function $f_\Phi$ produced by the power amplifier 20 as shown above (equation (2)), and receives as input the amplitude of the input |x| of the power amplifier 20, as shown in FIG. 2.

Specifically, the second neural network 34 is optimised so that the sum of the phase distortion functions $f_\Phi$ and its opposite $f_{-\Phi}$ is zero:

$$f_\Phi(|x|) + f_{-\Phi}(|x|) = 0 \quad (7)$$

where $f_{-\Phi}(|x|) = \gamma_1(|x|)g_2(|x|)$ with:

$\gamma_1(|x|) = (1+e^{-\beta(|x|-\omega\Phi)})^{-1}$ and $g_2(|x|) = \sum_{j=1}^{N_n^\Phi} \omega_j^\Phi [\text{ReLu}(W_\Phi|x|+b_\Phi)]_j$ where $\beta, \omega_\Phi, \omega_j^\Phi \in \mathbb{R}$, $W_\Phi \in \mathbb{R}^{1 \times N_n^\Phi}$ and $b_\Phi \in \mathbb{R}^{1 \times N_n^\Phi}$ are the weights of the second neural network whose initial value is optimised by meta-learning, ReLu is the rectified linear unit activation function, and where $N_n^\Phi$ corresponds to the number of neurons of the second neural network 34, for example advantageously according to the present invention $N_n^\Phi$ is substantially comprised between four and six neurons for the phase correction so that the total number of neurons implemented using the two neural networks 32 and 34 respectively dedicated to amplitude and phase correction is between twelve and sixteen neurons, the configuration with twelve neurons offering efficient results by numerical simulation.

In a similar way to the first neural network 32, as illustrated in FIG. 2, the second neural network 34 is configured to also receive the input $L_{AM/PM}$ such as for example $$L_{AM/PM} = \frac{1}{N}\sum_{k=1}^{N} \|\Phi(z) + (-\overline{\Phi(z)})\|^2,$$

the input $L_{AM/PM}$ corresponds to a cost function corresponding to the mean squared error between the phase of the signal provided by the power amplifier 20 (i.i.e. corresponding to the amplitude of the output signal of the radio frequency transmitter 16), the phase $\Phi$ resulting from the conjugate (.)* of the input signal x considering:

$z = x*y$ $z = |x|\cdot|y|e^{i(arg(y)-arg(x))}$ $arg(z) = f_\Phi(|x|)$ \hfill (8)

This cost function $L_{AM/PM}$ is suitable for use by an optimisation module 36 of the digital predistortion linearising device 18, as described below.

In fact, in addition to the previously described digital predistortion module 30, the digital predistortion linearising device 18 according to the present invention also comprises a module for optimising 36 the first neural network 32 and for optimizing the second neural network 34, being configured to implement:

a meta-learning of the first neural network 32, and
a meta-learning of the second neural network 34.

In particular, the optimisation module 36 is configured to implement each meta-learning from a set of operating data of the power amplifier, each meta-learning comprising a plurality of distinct "prediction tasks" respectively associated with distinct groups of operating data and metadata from the data set, the distinct groups of data being representative of distinct use cases of the power amplifier, the optimisation module 36 being configured to implement the meta-learning of the first neural network 32, and the meta-learning of the second neural network 34, using:

from a first part of said previously obtained data set, a meta-initialisation of the first neural network, respectively of the second neural network, providing beforehand an initialisation of the initial weights of the first neural network, respectively of the second neural network;

from said initial weights and a second part of said data set corresponding to the current use case of the power amplifier, a meta-matching of the initial weights into optimal weights of the first neural network, respectively of the second neural network;

the optimisation module 36 being configured to train the first neural network 32 and the second neural network 34 by optimising a cost function.

In particular, the optimisation module 36 is configured to train the first neural network 32 and the second neural network 34 using an indirect learning algorithm ILA and optimising a cost function corresponding to the mean squared error:

$L_{AM/AM}$ for the first neural network 32 dedicated to the correction of the amplitude distortion introduced by the power amplifier 20, and $L_{AM/PM}$ for the second neural network 34 dedicated to the correction of the phase distortion introduced by the power amplifier 20;

and this, according to a first example, by using an ADAM optimiser as described in the paper by P. K. Diederik et al. entitled "*ADAM: A Method for Stochastic Optimization*", or a RADAM (Rectified ADAM, ADAM for "Adaptative Momentum estimation") optimiser as described in L. Liu et al.'s paper "*On the Variance of the Adaptative Learning Rate and Beyond*" to improve the convergence of the solution, and using gradient descent to update the parameters of each neural network 32 and 34 of the digital predistortion module 30.

The operation of the optimisation module 36 will be further detailed in relation to FIG. 3 below, which shows a second example embodiment.

According to another particular complementary and optional aspect, detailed hereinafter in relation to FIG. 4, the digital predistortion linearising device 18 according to the present invention further comprises a data acquisition module 38 configured to feed each group of operating and metadata data distinct from the data set of the power amplifier 20 by sampling at the output of the radio frequency transmitter 16 a predetermined number of symbols, the set of sampled symbols conforming to a predetermined statistical distribution in amplitude of said predetermined number of symbols.

The use of such an acquisition module 38 aims to optimise the amount of training data used, particularly for an online calibration phase.

In relation to FIG. 3, the operation of the optimisation module 36 is described in more detail below, the main purpose of which is to make the digital predistortion linearising device 18 according to the present invention adaptive, in order to easily adapt, and in particular almost in real time, or even directly in real time, the linearisation in the presence of a change in the operation of the power amplifier in question or in the presence of a change in the usage context, which is currently not very easy with the current linearisation techniques, which only provide an optimal result for a particular use case (i.e. configuration), and require heavy re-learning in terms of time, learning data and resources to re-optimise the neural network(s) associated with the digital predistortion of a particular amplifier or when there is a change in the usage context.

Figure 3:
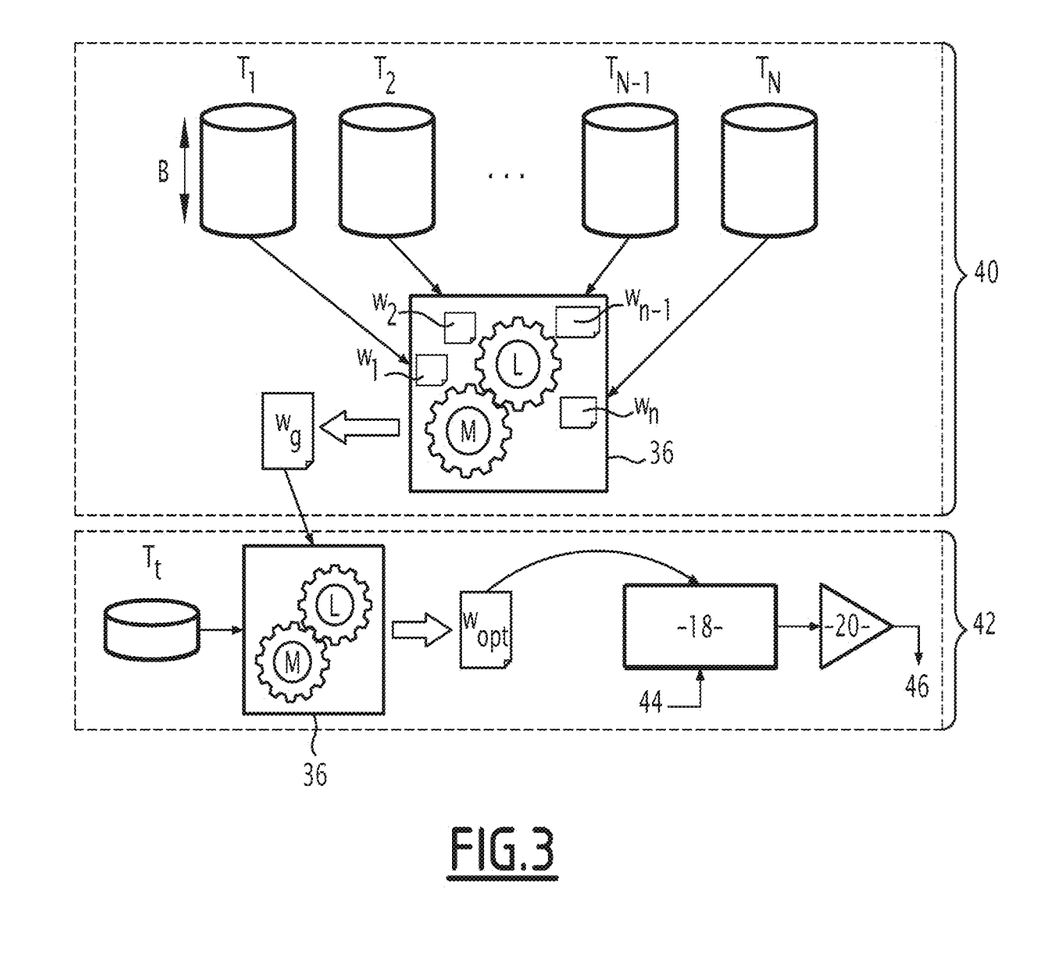
FIG. 3 illustrates the meta-learning implemented by the optimisation module of the linearising device, by digital predistortion according to the present invention.

To this end, as illustrated in FIG. 3, and as previously indicated, the optimisation module 36 is configured to implement each meta-learning from a set of operating data of the power amplifier, each meta-learning comprising a plurality of distinct prediction tasks $T_1, T_2, \ldots T_{N-1}$ and $T_N$ respectively associated with distinct groups of operating data and metadata of the data set, the distinct groups being representative of distinct use cases of the power amplifier.

In particular, in FIG. 3 each prediction task $T_1, T_2, \ldots T_{N-1}$ and $T_N$ is in particular associated with B distinct OFDM symbols, for example, when the radio frequency transmitter is for example an OFDM transmitter, with B an integer number of OFDM symbols associated with a distinct value, from one prediction task to another, characterising a variation in the behaviour of the power amplifier 20, such a variation being for example associated with a particular operating temperature, a particular supply current and/or voltage, a transmission antenna adaptation, a usage pressure, or a combination of at least two of these factors, which variation is then theoretically translated into a variation of the transition factor ρ of the theoretical Rapp model as expressed previously using equation (3).

The meta-learning specifically implemented by the optimisation module 36 aims to "learn to learn" each of the neural networks 32 and 34, previously described and dedicated respectively to the amplitude and phase linearisation of the power amplifier 20, to adapt in the event of a change in the operation of the power amplifier in question or when there is a change in the usage context, doing so by means of learning using the plurality of distinct tasks (usage configuration) previously described, whereas conventional learning techniques based on a "single-case" or "single usage context" optimisation are currently unsuitable for simply and quickly providing such an adaptation, which results in inadequate energy consumption.

Conversely, according to the present invention, in particular during an off-line learning step 40, the optimisation module 36 is suitable for "learning to learn" by meta-learning, to each of the neural networks 32 and 34, the specific weights associated respectively with each prediction task (i.e. with each operation and/or usage context of the power amplifier, also called the usage configuration of the power amplifier 20).

For example, the specific weights $w_1$ are learned for the prediction task $T_1$, the specific weights $w_2$ are learned for the prediction task $T_2$, ..., then the specific weights $w_{n-1}$ are learned for the prediction task $T_{N-1}$, and finally the specific weights $w_N$ are learned for the prediction task $T_N$, which specific weights the optimisation module 36 transforms (i.e. generalises) into a single set of generic initialisation weights $w_g$ in accordance with the concept of meta-learning.

Such generic initialization weights $w_g$ are then directly used, in particular during an on-line adaptation step 42, to be adapted into optimal weights $w_{opt}$ for the current use case of the power amplifier 20 associated this time with the prediction spot $T_t$ at the instant t for application to a radio frequency signal 44 by the digital predistortion linearising device 18, prior to the action of the power amplifier 20 for generating a power amplified signal 46.

In other words, the meta-learning specifically implemented according to the present invention for configuring a power amplifier 20 linearising device 18 employing digital predistortion makes it possible to start from a set of initial generic weights $w_g$ obtained during a multi-configuration learning of use of the power amplifier 20, and advantageously implemented off-line, in order to then be adapted, on-line, into a set of optimal weights $w_{opt}$ only for data associated with the current usage configuration of the power amplifier 20, which allows a rapid adaptation from a limited set of data $T_t$, contrary to the current neural network-based linearisation techniques, which are optimal for a single usage configuration and unsuitable for adapting rapidly to a change in configuration.

According to an optional particular aspect, the optimisation module 36 is configured to implement, according to a second example, a meta-learning of the weights of the first neural network 32, and/or a meta-learning of the weights of the second neural network 34, using a Model-Agnostic Meta-Learning (MAML) model agnostic meta-learning for fast adaptation of neural networks as introduced by C. Finn et al. in the document entitled *"Model-Agnostic Meta-Learning for Fast Adaptation of deep Networks"*.

The purpose of such MAML meta-learning is to determine the best initialization weights of each neural network 32 and 34 used for subsequent inference on the dataset $T_t$. Given this objective, such a meta-learning provides an optimised initialiser, whereas in conventional learning the neural network weights are usually randomly initialised, which is likely to slow down convergence and lead to poor generalisation.

Applying the MAML meta-learning to the representation of FIG. 3, such a MAML meta-learning is likely to comprise two main steps corresponding on the one hand to the learning step 40, in particular offline, allowing the determination of the best initial weights $w_g$ of each of the neural networks 32 and 34, and on the other hand to the adaptation step 42, in particular online, allowing to converge towards the weights $w_{opt}$ adapted to the current use case.

In other words, according to the present invention, the optimisation module 36 is configured to implement the meta-learning of the first neural network 32, and the meta-learning of the second neural network 34, using:

from a first part of said previously obtained data set, a meta-initialisation 40 of the first neural network, respectively of the second neural network, providing beforehand an initialisation of the initial weights of the first neural network, respectively of the second neural network;

from said initial weights and a second part of said data set corresponding to the current use case of the power amplifier, a meta-matching 42 of the initial weights into optimal weights of the first neural network, respectively of the second neural network;

More precisely, taking as an example the particular case of using a MAML meta-learning, each prediction task is characterised by two distinct data subsets, namely a subset $D_i^{tr}$ of training (i.e. learning) data and a subset $D_i^{te}$ of test data, each prediction task $T_i$, with $1 \leq i \leq N$, as indicated previously, being associated with a variation in the behaviour of the power amplifier 20 which is specific to it, such a variation being associated, for example, with a particular operating temperature, a specific current and/or a specific supply voltage, an adaptation of the transmitting antenna, an operating pressure, or a combination of at least two of these factors, which variation is then theoretically translated into a variation of the transition factor ρ (knee factor) of the theoretical Rapp model as expressed previously using equation (3).

As an explanatory example, to determine the solutions of the equation y=C sin x+φ where C and φ correspond to amplitude and phase respectively, using MAML meta-learning, it is possible to learn from multiple prediction tasks $T_i$, parameterised by distinct values of C and φ, each prediction task $T_i$, consisting of retrieving y from x with different amplitudes and different phases.

Specifically, using MAML meta-learning, for each prediction task $T_i$, the specific weights $w_i$, for example the specific weights $w_1$ for the prediction task $T_1$, are learned using gradient descent, a gradient descent step being such that:

$$w_i = W_g - \varepsilon \nabla_{w_g} L(w_g, D_i^{tr}) \qquad (9)$$

where ε is an internal learning rate that makes it possible to control the gradient descent in order to minimise the cost function L corresponding to one of the cost functions $L_{AM/AM}$ or $L_{AM/PM}$ mentioned above, the operator $\nabla_{w_g}$ indicating that the gradients of the considered function L are evaluated with respect to the initial weights $w_g$, this first gradient descent step being conventionally called "meta-update" or "internal loop" and implemented for each prediction task $T_i$. Then the generic weights $w_g$ are determined using MAML meta-learning by solving the following optimisation problem:

$$\min_{w_g} \sum_i L(w_i, D_i^{te}) \quad (10)$$

by means of a gradient descent leading to:

$$w_g = w_g - \mu \nabla_{w_g} \Sigma_i L(w_i, D_i^{te}) \quad (11)$$

where μ is an external learning rate, this second gradient descent step being conventionally called "meta-optimisation" or "external loop".

The MAML meta-updates specific to each prediction task $T_i$ and then the MAML meta-optimisation form a MAML meta-initialisation 40, in particular offline, of the initial weights $w_g$ of the first neural network 32 and the second neural network 34 respectively.

In other words, according to this second example, the MAML meta-learning applied to the invention firstly makes it possible to optimise each of the aforementioned cost functions $L_{AM/AM}$ or $L_{AM/PM}$ with a reduced number of iterations, and then the sum of the optimised cost functions $L_{AM/AM}$ and $L_{AM/PM}$ is minimised to derive the initial weights $w_g$. Such a sum minimization according to the MAML meta-learning applied to the invention is specific and original compared to the current state of the art.

Once the initial weights $w_g$ of the first neural network 32 and the second neural network 34 respectively have been determined, the MAML meta-learning implements an online inference step 42 (i.e. of meta-matching) corresponding to the meta-matching of the initial weights $w_g$ of the first neural network 32 and of the second neural network 34 respectively into optimal weights $w_{opt}$ matched only to the data associated with the current use configuration of the power amplifier 20, which allows fast matching from a limited data set $T_t$, avoiding the conventional implementation of a random initialization, the optimal weights $w_{opt}$ being obtained in the following form:

$$w_{opt}^k = w_{opt}^{k-1} - \nabla_{w_{opt}^{k-1}} L(w_{opt}^{k-1}, D^{tr}) \quad (12)$$

with k=1, ..., M, M being the number of gradient descent steps considering $w_{opt}^0 = w_g$ and $D^{tr}$ the training (i.e. learning) data subset of the prediction task $T_t$ at time t associated with the current use case of the power amplifier.

According to a particular aspect, the optimisation module 36 is configured to implement an ADAM optimiser to optimise the meta-matching step 42.

Optionally, to accelerate and ensure the convergence of the MAML meta-learning, it is possible according to the present invention to replace the optimisers suitable for implementing a stochastic gradient descent (SGD) according to equations (9) and (11) by optimisers such as the aforementioned ADAM or RADAM optimisers, suitable for improving convergence by adapting the learning rate(s) (internal and/or external), and suitable for implementing a stochastic gradient descent SGD according to equations other than the aforementioned equations (9) and (11).

Optionally, it is still possible to improve the MAML meta-learning, by optimising the external loss after each internal loop instead of optimising it once all the internal loops have been completed, which notably improves the stability of the gradient.

Other optimisations of MAML meta-learning, such as those introduced by A. Antoniou et al. in the paper "*How to train your MAML*" could also be implemented as an improvement to the present invention.

Figure 4:
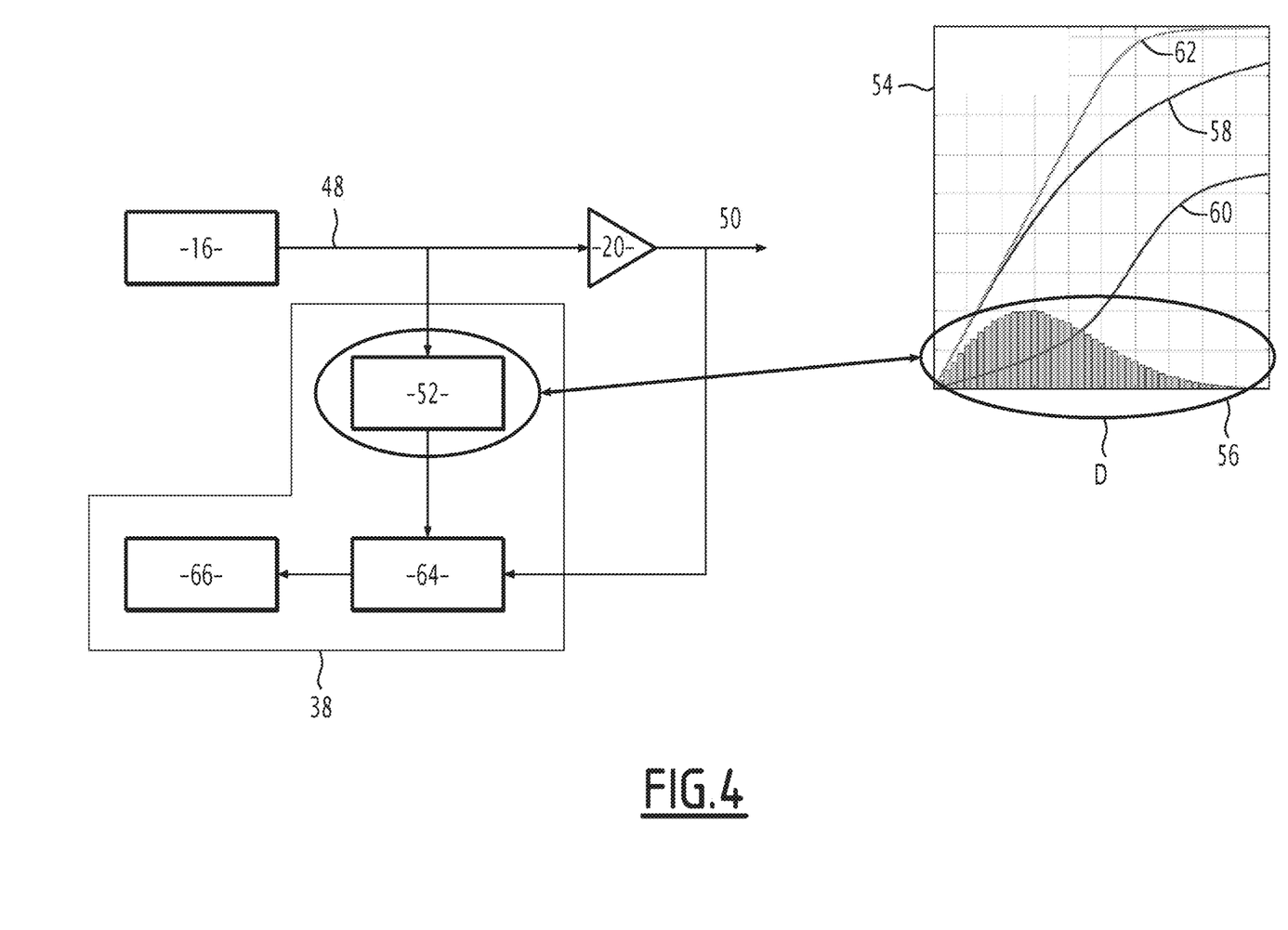
FIG. 4 illustrates the operation of the optional data acquisition module of the linearising device by digital predistortion according to the present invention.

FIG. 4 illustrates the operation of the optional data acquisition module 38 of the linearising device by digital predistortion according to the present invention. In particular, the data acquisition module 38 configured to feed, for each prediction task, each associated group of distinct operating data from the power amplifier 20 data set by sampling from the output of the radio frequency transmitter 16 and/or from the output of the power amplifier 20 a predetermined number of symbols, the set 48 of the sampled symbols conforming to a predetermined statistical distribution in magnitude of said predetermined number of symbols.

The use of such an acquisition module 38 aims at optimising (i.e. carefully determine) the amount of data of each data group associated with a prediction task, each prediction task characterising a variation in the behaviour of the power amplifier 20, such variation being associated for example with a particular operating temperature, a particular supply current and/or voltage, an adaptation of the transmission antenna, an operating pressure, or a combination of at least two of these factors, such variation then theoretically translating into a variation in the knee factor ρ of the theoretical Rapp model as expressed previously using equation (3).

In particular, the plurality of prediction tasks suitable to be used according to the present invention is representative of a transition factor ρ such as p∈[0,7,1,5] with for example p=0.7+0.05j, j∈[0, 17], which corresponds to the use of seventeen distinct prediction tasks associated respectively with seventeen usage configurations of the power amplifier 20 distinct by one or more use parameters such as the particular operating temperature, a particular supply current and/or voltage, an adaptation of the transmission antenna, an operating pressure, or a combination of at least two of these factors, to then theoretically result in a variation of the corresponding transition factor ρ. These seventeen separate prediction tasks are, according to the present invention, sufficient to achieve optimal convergence of the MAML meta-learning.

It should be noted that according to the present invention, using a larger prediction task distribution (i.e. with a larger number of prediction tasks) is not recommended as it is likely to include an insufficient number of non-linear operating model configurations of the power amplifier, which would make the meta-model accurate on the linear model configurations and less accurate on the non-linear models, and thus less likely to allow for correction of the non-linearities introduced by the power amplifier 20, while at the same time increasing the processing time.

Furthermore, for optimal convergence of the optimization module 36 implementing MAML meta-learning, a predetermined number B=1,000 k, with k∈[1,10] of symbols per subset $D_i^{tr}$ of training (i.e. learning) data and per subset $D_i^{te}$ of test data of each prediction task is preferentially used, in particular B such that 2,000<B<5,000, and for example advantageously B=3,000 input 48 and output 50 OFDM symbols of the power amplifier 20, when an OFDM transmitter 16 is implemented, these 3,000 OFDM symbols being, for example, divided into batches of 1,000 OFDM symbols, each batch being associated with an iteration (gradient step) of the internal gradient descent loop of the meta-learning, which in fact comprises three iterations during the training phase of the neural networks 32 and 34.

Using more internal loops in training would not effectively improve the final performance of the digital predistortion linearising device 18, and would slow down its processing. According to this example, the total amount of data consumed for training each neural network 32 and 34 would be, according to an estimate by numerical simulation, substantially equal to 51,000 OFDM symbols with a number of epochs of the order of 250 and internal learning rates ε and external learning rates μ equal to $10^{-3}$ and $5 \cdot 10^{-4}$ respectively.

Furthermore, as illustrated in FIG. 4, the present invention, via the acquisition module 38 proposes to optimise the construction of each group of B data associated with each subset of data $D_i^{tr}$, $D_i^{te}$ of each prediction task, by verifying via a verification module 52 of the acquisition module 38 that each input symbol 48 of the power amplifier 20 conforms to a predetermined statistical distribution in amplitude D of the number B of symbols to be taken in order to fully cover the considered operating model of the power amplifier 20.

Such a statistical distribution in amplitude D is obtained beforehand, in particular by taking into account the modulation used, for example a 64-QAM. In FIG. 4, such a statistical distribution in amplitude D is illustrated by representation 54 and defines a distribution of the B symbols by amplitude level, and this with regard to the transfer functions 58, 60, and 62 respectively associated with the power amplifier 20, with the digital predistortion linearising device 18, and to the assembly resulting from the combination of the digital predistortion linearising device 18 followed by the power amplifier 20, these transfer functions illustrating the excited zone of the power amplifier 20 associated with each class of the histogram of the statistical distribution in amplitude D.

For example, the statistical distribution in amplitude D consists of two symbols with amplitude one (or between zero and one), four symbols with amplitude two (or between one and two), five symbols with amplitude three (or between two and three), eight symbols with amplitude four (or between three and four), etc.

When an input symbol 48 of the power amplifier 20 conforms to the distribution D, a switch 64 enables the acquisition of that input symbol 48 in a data subset 66, as well as the acquisition of the output symbol 50 corresponding to that input symbol 48 enabled for acquisition.

According to the previous example of the statistical distribution in amplitude D, the input symbol 48 entering the verification module 52 has, for example, an amplitude equal to two, and the data subset 66 already includes three OFDM symbols of amplitude equal to two out of four symbols allowed according to the statistical distribution in amplitude D. There is therefore one space left in the data subset 66 according to the statistical distribution in amplitude D, and the verification module 52 controls the switch 64 to allow the acquisition of this input symbol 48, and to complete the number B of symbols to be picked in terms of symbols with an amplitude equal to two.

On the other hand, when a next symbol 48 entering the verification module 52 also has an amplitude equal to two, the verification module 52 orders the switch 64 to reject the acquisition of this next input symbol 48, the number B of symbols to be picked in terms of symbols having an amplitude equal to two being already full for this amplitude level (i.e. the column associated with the amplitude level two of the histogram D being already full in terms of number of symbols).

Thus, the acquisition module 38 allows only those symbols relevant to satisfying the statistical distribution in amplitude D to be taken, such an acquisition module being suitable for implementation off-line and on-line, and thus minimising data usage while ensuring that the data subset 66 is sufficiently relevant by conforming to the statistical distribution in amplitude D.

Not shown, the present invention also relates to a method of linearisation, by adaptive digital predistortion, of a power amplifier 20 of the communication system 10 comprising a radio frequency transmitter configured to transmit at least one frame of symbols previously described in relation to FIG. 1, the method according to the present invention being implemented by the digital predistortion linearising device 18 as previously described.

More precisely, such a method according to the present invention comprises a step, not shown, of digitally predistorting the signal provided by the radio frequency transmitter 16 by determining a polar predistortion to be applied to said signal by implementing an inference step by:
  the first neural network 32 configured to correct an amplitude distortion associated with the power amplifier; and
  the second neural network 34 configured to correct a phase distortion associated with the power amplifier.

Furthermore, the method according to the present invention comprises a step of optimizing the first neural network and optimizing the second neural network by:
  a meta-learning of the first neural network, and
  a meta-learning of the second neural network,
each meta-learning being implemented from a set of operating data of the power amplifier, each meta-learning comprising a plurality of distinct prediction tasks respectively associated with distinct groups of operating data and metadata from the data set, the distinct groups being representative of distinct use cases of the power amplifier,
the meta-learning of the first neural network, and the meta-learning of the second neural network, comprising:
  from a first part of said previously obtained data set, a meta-initialisation of the first neural network, respectively of the second neural network, providing beforehand an initialisation of the initial weights of the first neural network, respectively of the second neural network;
  from said initial weights and a second part of said data set corresponding to the current use case of the power amplifier, a meta-matching of the initial weights into optimal weights of the first neural network 32, respectively of the second neural network 34;

It should be noted that the previously described alternative embodiments of the previously described digital predistortion linearising device 18 are similarly applicable to the method according to the present invention.

The skilled person will understand that the invention is not limited to the embodiments described, nor to the specific examples of the description, the embodiments and variants mentioned above being capable of being combined with each other to generate new embodiments of the invention.

The present invention thus provides a solution for quickly adapting the linearisation, by digital predistortion, of a power amplifier to any usage configuration of the power amplifier, doing so with low complexity, thus saving the computational resources implemented, and consequently the associated computing power.

In particular, the present invention takes advantage, on the one hand, of a polar decomposition of the processing by neural networks by using separately two neural networks of low complexity (comprising, in particular, ten neurons each) designed to measure and dedicated respectively to the correction of the amplitude and phase distortions introduced by the power amplifier, and on the other hand, a meta-learning system that limits the time required to adapt the optimal weights of each network in the event of a change in the configuration of use while remaining efficient in terms of linearisation, as such a meta-learning system has not been used until now to optimise power amplifier linearisation by employing digital predistortion.

In addition, optionally, the present invention provides a training data acquisition optimised to take an optimal and limited amount of data while ensuring that the data thus taken allows for efficient and convergent training.

The invention claimed is:

1. A device for linearising, by digital predistortion, a power amplifier of a communication system comprising at least one radio frequency transmitter configured to transmit at least one frame of symbols, the linearising device comprising:
    a module for digitally predistorting the signal supplied by the radio frequency transmitter configured to infer a polar domain predistortion to be applied to said signal, the predistortion module having an indirect neural network learning architecture and comprising:
        a first neural network configured to correct an amplitude distortion produced by the power amplifier by receiving as input the amplitude of an output $|y|$ of the power amplifier, the first neural network being configured to provide a reciprocal function $\widehat{f_\rho^{-1}}$ of the amplitude distortion function produced by the power amplifier;
        a second neural network configured to correct a phase distortion produced by the power amplifier by receiving as input the amplitude of an input $|x|$ of the power amplifier, the second neural network being configured to provide a phase function $f_{-\Phi}$, providing the opposite in phase of each phase;
wherein the linearising device further comprises:
    a module for optimising the first neural network and optimising the second neural network configured to implement:
        a meta-learning of the first neural network, and
        a meta-learning of the second neural network,
the optimisation module being configured to implement each meta-learning from a set of operating data of the power amplifier, each meta-learning comprising a plurality of distinct prediction tasks respectively associated with distinct groups of operating data and metadata from the data set, the distinct groups being representative of distinct use cases of the power amplifier;
the optimisation module being configured to implement the meta-learning of the first neural network, and the meta-learning of the second neural network, using:
    from a first part of said previously obtained data set, a meta-initialisation of the first neural network, respectively of the second neural network, providing beforehand an initialisation of the initial weights of the first neural network, respectively of the second neural network;
    from said initial weights and a second part of said data set corresponding to the current use case of the power amplifier, a meta-matching of the initial weights into optimal weights of the first neural network, respectively of the second neural network;
the optimisation module being configured to train the first neural network and the second neural network by optimising a cost function.

2. The device according to claim 1, wherein the first neural network configured to correct an amplitude distortion produced by the power amplifier receives as input the amplitude of the output $|y|$ of the power amplifier, the first neural network being configured to provide a reciprocal function $\widehat{f_\rho^{-1}}$ of the amplitude distortion function produced by the power amplifier; such that:

$$\widehat{f_\rho^{-1}}(|y|) = g_0(|y|) + g_1(|y|) \text{ with:}$$

$$g_0(|y|) = \gamma_0(|y|) + (1-\gamma_0(|y|))|y| \text{ where } \gamma_0(|y|) = (1+e^{-\alpha(|y|-\omega^\rho)})^{-1}, \text{ and}$$

$$g_1(|y|) = \Sigma_{j+1}^{N_n^\rho} \omega_j^\rho [\text{ReLu}(W_\rho |y| b_\rho)]_j$$

where $\alpha, \omega_\rho, \omega_j^\rho \in \mathbb{R}$, $W_\rho \in \mathbb{R}^{1 \times N_n^\rho}$ and $b_\rho \in \mathbb{R}^{1 \times N_n^\rho}$ are the weights of the first neural network whose initial value is optimised by meta-learning, ReLu is the activation function of the rectified linear unit, and where $N_n^\rho$ corresponds to the number of neurons in the first neural network.

3. The device according to claim 1, wherein the second neural network configured to correct a phase distortion produced by the power amplifier, receives as input the amplitude of the input $|x|$ of the power amplifier, the second neural network being configured to provide a phase function $f_{-\Phi}$ providing the phase opposite of each phase such that:

$$f_{-\Phi}(|x|) = \gamma_1(|x|) g_2(|x|) \text{ with:}$$

$$\gamma_1(|x|) = (1+e^{-\beta(|x|-\omega\Phi)})^{-1} \text{ and } g_2(|x|) = \Sigma_{j=1}^{N_n^\Phi} \omega_j^\Phi [\text{ReLu}(W_\Phi |x| + b_\Phi)]_j$$

where $\beta, \omega_\Phi, \omega_j^\Phi \in \mathbb{R}$, $W_\Phi \in \mathbb{R}^{1 \times N_n^\Phi}$ and $b_\Phi \in \mathbb{R}^{1 \times N_n^\Phi}$ are the weights of the second neural network whose initial value is optimised by meta-learning, ReLu is the activation function of the rectified linear unit, and where $N_n^\Phi$ corresponds to the number of neurons in the second neural network.

4. The device according to claim 1, wherein each separate prediction task is at least associated with a separate value characterising a variation in the behaviour of the power amplifier.

5. The device according to claim 1, wherein the optimisation module is configured to implement meta-learning of the weights of the first neural network, and/or meta-learning of the weights of the second neural network, using meta-learning agnostic to the neural network model used.

6. The device according to claim 1, wherein the optimisation module is configured to train the first neural network and the second neural network by optimising a cost function corresponding to the mean squared error by means of an ADAM or RADAM optimiser.

7. The device according to claim 1, comprising a data acquisition module configured to populate each separate operating and metadata data group of the power amplifier data set by taking a predetermined number of symbols from the output of the radio frequency transmitter, the set of taken symbols conforming to a predetermined statistical distribution in amplitude of said predetermined number of symbols.

8. A communication system comprising at least successively:
    a radio frequency modulator;
    a radio frequency transmitter configured to transmit at least one frame of symbols whose input is connected to an output of the frequency modulator;
    a device for linearising by digital predistortion according to claim 1, an input of the device for linearising being connected to the output of said radio frequency transmitter; and
    a power amplifier whose input is connected to an output of the device for linearising, the communication system comprising a feedback loop from the power amplifier to the device for linearising.

9. A method of linearising, by adaptive digital predistortion, a power amplifier of a communication system comprising a radio frequency transmitter configured to transmit at least one frame of symbols, wherein the method comprises the following steps:
- a step of digitally predistorting the signal provided by the radio frequency transmitter by determining a polar predistortion to be applied to said signal by implementing an inference step through:
  - a first neural network configured to correct an amplitude distortion associated with the power amplifier; and
  - a second neural network configured to correct a phase distortion associated with the power amplifier,
- a step of optimizing the first neural network and optimizing the second neural network by:
  - a meta-learning of the first neural network, and
  - a meta-learning of the second neural network, each meta-learning being implemented from a set of operating data of the power amplifier, each meta-learning comprising a plurality of distinct prediction tasks respectively associated with distinct groups of operating data and meta-data from the data set, the distinct groups being representative of distinct use cases of the power amplifier, the meta-learning of the first neural network, and the meta-learning of the second neural network, comprising:
- from a first part of said previously obtained data set, a meta-initialisation of the first neural network, respectively of the second neural network, providing beforehand an initialisation of initial weights of the first neural network, respectively of the second neural network;
- from said initial weights and a second part of said data set corresponding to the current use case of the power amplifier, a meta-matching of the initial weights into optimal weights of the first neural network, respectively of the second neural network.

10. A non-transitory computer-readable medium including a computer program comprising software instructions which, when executed by a computer, implement a linearisation method according to claim 9.

\* \* \* \* \*